(12) United States Patent
Tsai

(10) Patent No.: US 7,181,591 B2
(45) Date of Patent: Feb. 20, 2007

(54) MEMORY ADDRESS DECODING METHOD AND RELATED APPARATUS BY BIT-PATTERN MATCHING

(75) Inventor: Jacky Tsai, Taipei Hsien (TW)

(73) Assignee: VIA Technologies Inc., Hsin-Tien (TW)

( * ) Notice: Subject to any disclaimer, the term of this patent is extended or adjusted under 35 U.S.C. 154(b) by 361 days.

(21) Appl. No.: 10/708,103

(22) Filed: Feb. 10, 2004

(65) Prior Publication Data

US 2004/0168012 A1    Aug. 26, 2004

(30) Foreign Application Priority Data

Feb. 21, 2003    (TW)    .............................. 92103723 A

(51) Int. Cl.
*G06F 12/00* (2006.01)
(52) U.S. Cl. .................. 711/212; 711/207; 711/220
(58) Field of Classification Search ................ 711/108, 711/157, 202, 207, 212, 200, 220
See application file for complete search history.

(56) References Cited

U.S. PATENT DOCUMENTS

| | | | |
|---|---|---|---|
| 3,938,100 A | 2/1976 | Steiner | |
| 3,982,231 A | 9/1976 | Bernstein et al. | |
| 4,025,903 A | 5/1977 | Kaufman et al. | |
| 4,234,934 A | 11/1980 | Thorsrud | |
| 4,400,794 A * | 8/1983 | Koos | ..................... 711/202 |
| 4,468,729 A | 8/1984 | Schwartz | |
| 4,587,610 A | 5/1986 | Rodman | |
| 4,654,787 A | 3/1987 | Finnell et al. | |
| 4,730,251 A | 3/1988 | Aakre et al. | |
| 4,860,252 A | 8/1989 | Sykora | |
| 4,914,577 A * | 4/1990 | Stewart et al. | ............... 711/207 |
| 4,965,720 A | 10/1990 | Mitchell et al. | |
| 5,737,572 A * | 4/1998 | Nunziata | ..................... 711/157 |
| 5,835,963 A * | 11/1998 | Yoshioka et al. | ............ 711/207 |
| 6,128,718 A * | 10/2000 | Schmisseur et al. | ......... 711/212 |
| 6,219,748 B1* | 4/2001 | Srinivasan et al. | ......... 711/108 |
| 6,321,316 B1* | 11/2001 | Manning | ..................... 711/167 |
| 6,389,507 B1* | 5/2002 | Sherman | ..................... 711/108 |
| 7,013,355 B2 | 3/2006 | Chambers | |

OTHER PUBLICATIONS

David A. Huffman, "A Method for the Construction of Minimum-Redundancy Codes", Proceedings of the I R E, Sep. 1952, pp. 1098-1101.
Jim Handy, "THE authoritative reference on cache design, The Cache Memory Book", 1998, pp. 22 2nd ed . Academic Press, Inc, San Diego, CA.
Dan Hirschhero, "3 Static Defined-Word Schemes Data Compression", Apr. 27, 1999 ( http://www.ics.uci.ed/~drm/pubs/DC-Sec3.html ).

* cited by examiner

*Primary Examiner*—Pierre Bataille
*Assistant Examiner*—Hetul Patel
(74) *Attorney, Agent, or Firm*—Winston Hsu

(57) ABSTRACT

An address decoding method and related apparatus for deciding which section of a memory device a given address belongs. The memory device has a plurality of sections, each section has a plurality of memory units, and each memory unit has a unique address. The method includes: comparing some specific bits of the given address with predetermined values for deciding which section the given address belongs.

14 Claims, 12 Drawing Sheets

MEMORY ADDRESS DECODING METHOD AND RELATED APPARATUS BY BIT-PATTERN MATCHING

BACKGROUND OF INVENTION

1. Field of the Invention

The present invention relates to an address decoding method and related apparatus, and more specifically, to an address decoding method and related apparatus which can decode a memory address rapidly by comparing if some specific bits of the given address match predetermined values.

2. Description of the Prior Art

Please refer to FIG. 1. FIG. 1 shows function blocks of a conventional computer 10. The computer 10, as a microprocessor system, comprising a CPU 12, a chip set 14, a memory 16, a display card 18, a monitor 20, peripheral devices 22, and a BIOS system 24.

The memory 16 usually comprises several memory modules such as memory modules 30A to 30D shown in FIG. 1. Memory modules 30A to 30D comprise a plurality of memory units 34. Each memory unit 34 stores one bit of data. To sum all memory units 34 in memory modules 30A to 30D, we get the total memory capacity of the memory 16. In modern technology, a memory module is usually implemented by an independent circuit, connected to the computer 10 through sockets to form the memory 16. Different memory modules have memory units of different capacity (each memory module could have different memory capacity). Generally speaking, memory units in the memory module are distributed in two memory ranks. For example, as shown in FIG. 1, memory module 30A has two memory ranks 32A and 32B. The control circuit 28 will control one memory rank with one control signal to read/write data. As shown in FIG. 1, control signals CSp0 and CSp1 correspond to two memory ranks 32A and 32B in memory module 30A respectively. Control signals CSp2 to CSp7 correspond to memory ranks of memory modules 30B, 30C, and 30D respectively.

As for assignment of the address of each memory unit in the memory 16, please refer to FIG. 2 (also FIG. 1). FIG. 2 shows the assigned memory unit addresses in the memory 16. As shown in FIG. 2, suppose that memory modules 30A to 30D have $2^{25}$ (2 to the power of 25), $2^{27}$, $2^{28}$, and $2^{26}$ memory units respectively. That is to say, the capacities of memory modules 30A to 30D are 32 Mbs, 128 Mbs, 256 Mbs and 64 Mbs. Here one Mbs (Megabits) represent $2^{20}$ bits. After the computer is turned on, the control circuit 28 will assign the numerically-increased addresses to each memory unit of memory module 30A to 30D. Of course, the binary system is the basic numerical expression in digital logic. The address of each memory unit is also expressed in the binary system. For example, as shown in FIG. 2, the address of each memory unit is expressed by 32 bits of the binary system. The "0th" bit is the least significant bit and the "31st" bit is the most significant bit. After assignment of the address, the first memory unit of memory module 30A will be assigned to address 36A. The expression is "000 . . . 0" (all bits are 0). Then, the following addresses of each memory unit are increased sequentially. For instance, the address of the second memory unit, 36B, is expressed as "00 . . . 01" (only the 0th bit is 1). The address of the third memory unit, 36C, is expressed as "00 . . . 10" (only the 1st bit is 1). The other situations are similar. The address of the second memory unit from the last one of memory module 30A, 36D, (the ($2^{25}$−1)th memory unit) is "0 . . . 01 . . . 10" (the first to the 24th bits are 1 and the others are 0). The address of the last memory unit of memory module 30A, 36E, (the ($2^{25}$)th memory unit) is increased to "0 . . . 01 . . . 11" (the 0th to the 24th bits are 1 and the others are 0).

When the control circuit 28 assigns addresses, it takes all memory units of all memory modules in the memory 16 as one part. Thus when the control circuit 28 assigns an address to the memory module 30B, the address will be continuously increased from address 36E (the address of the last memory unit of memory module 30A). As shown in FIG. 2, the first memory unit of memory module 30B corresponds to address 310. The value of the address will be increased from address 36E by one, becoming "0 . . . 010 . . . 0" (only the 25th bit is "1"). This means that the memory unit is seen as the ($2^{25}$+1)th memory unit in the memory 16 of the ($2^{25}$+1)th memory unit counted from the first memory unit of memory module 30A. Similarly, the second memory unit of memory module 30B is seen as the ($2^{25}$+2)th memory unit in the memory 16. The address value of the memory unit, corresponding to address 311, is the addition of the value of address 310 and one, becoming "0 . . . 010 . . . 01" (only the 0th bit and the 25th bit are 1). Because there are $2^{27}$ memory units in the memory module 30B, the last two memory units in the memory module 30B are the ($2^{25}$+$2^{27}$−1)th and the ($2^{25}$+$2^{27}$)th memory units in the memory 16. The addresses of these two memory units corresponding to 38C and 38D are increased to "0 . . . 01001 . . . 10" (the 1st to the 24th bits and the 27th bit are 1, and the others are 0) and "0 . . . 01001 . . . 1" (the 0th to the 24th bits and the 27th bit are 1, and the others are 0).

To deduce the other situations by the rules above, the address of the first memory unit, corresponding to address 42A, in memory module 30C (the third memory module) is the value of address 38D increased by 1, becoming "0 . . . 01010 . . . 0" (only the 25th and the 27th bits are 1). This expression represents that the memory unit is the ($2^{25}$+$2^{27}$+1)th one counted from the memory unit address 36A in the address 16. Similarly, the address of the $2^{28}$th memory unit, address 42B, in memory module 30C is increased to "0 . . . 011001 . . . 1" (the 0th to 24th bits and the 28th bit are 1, and the others are 0). This expression represents that the memory unit is the ($2^{25}$+$2^{27}$+$2^{28}$)th one counted from the memory unit address 36A in memory 16. From the first and the last addresses of each memory module, an ending address can be determined. As shown in FIG. 2, because all address values of the memory units in memory module 30A are less than the value of the first address 310 in the memory module 30B, address 310 can be taken as the end of the memory module 30A, address 46A. Similarly, the address values of memory units in each memory module 30B (and memory module 30A) are less than the value of the least address, address 42A, in the memory module 30C. Therefore address 42A can be seen as the corresponding ending address, address 46B, in memory module 30B. The address values of the memory module 30C as well as memory modules 30A and 30B are all less than the corresponding ending address, address 46C, in memory module 30C (That is also the least address, address 44A, in memory module 30D). Finally, all addresses of memory module 30D are less than the ending address 46D. Notice that ending addresses 46A to 46D are the binary results of accumulating capacity of each memory module. For instance, the ending address 46A represents the amount of $2^{25}$ in the binary system. It is also the memory capacity of memory module 30A (or the number of memory units in memory module 30A). The ending address 46B represents the amount of ($2^{25}+2^{27}$) in the binary system, meaning the total memory capacity of the memory modules 30A and 30B. The ending address 46C, representing ($2^{25}+2^{27}+2^{28}$) in the binary system, is the total capacity of the memory modules 30A, 30B, and 30C. Finally, ending address 46D, representing ($2^{25}+2^{27}+2^{28}+2^{26}$) in the binary system, is the total capacity of memory modules 30A, 30B, 30C, and 30D.

Please refer to FIG. 3 (and FIG. 1, 2). FIG. 3 illustrates the diagram of the conventional method in which the control circuit 28 decodes addresses. In the control circuit 28 there are a buffer module 51, a plurality of subtraction modules 410 to 48D, and a logic module 50. The buffer module 51 stores the address 54 for transmitting data to the control circuit 28 from the CPU 12 (or other circuits). The control circuit 28 will decode the address. In the prior art, when the control circuit 28 decides what memory module a given address 54 belongs to after decoding, the control circuit 28 can implement functions of the subtraction modules 410 to 48D and logic module 50 by methods of hardware or software. The subtraction modules 410 to 48D are used to take a difference of the given address 54 and the ending addresses 46A to 46D (please also refer to FIG. 2). Relative magnitudes of the given address 54 and the ending addresses 46A to 46D are determined by the result of the subtraction operation. The result of the subtractor is processed by the logic module 50 to determine the memory module that the address 54 belongs to, and generate a corresponding decoded result 52. For example, if the given address 54 will be smaller than each ending address 46A to 46D. If the given address 54 belongs to memory module 30B, the given address 54 will be smaller than each ending address 46B to 46D, but not ending address 46A. Similarly, if the memory unit that the given address 54 corresponds to belongs to the memory module 30C, the given address 54 is only smaller than ending address 46D, but not ending addresses 46A to 46C. Each subtraction module 48A to 48D is used to reduce ending address 46A to 46D by the given address 54 so as to determine the magnitude between the given address 54 and ending address 46A to 46D. The logic module 50 determines the memory module that the given address 54 belongs to according to the results of subtraction module 410 to 48D. As shown in FIG. 3, if the given address 54 is "0 . . . 010010 . . . 0" (only the 25th and the 28th bit are "1"), it is not smaller than ending addresses 46A and 46B, but is smaller than ending addresses 46C and 46D. Thus, the logic module 50 can decide that the given address 54 corresponds to the memory unit of the memory module 30C.

Generally speaking, when control circuit 28 designates addresses, it will give sequentially increased addresses to memory units belonging to one memory rank. For example, if the 32 Mbs of memory module 30A are distributed in the memory ranks 32A and 32B (please refer to FIG. 1), the first 16 Mbs of addresses will be given to the memory units of the memory rank 32A and the second 16 Mbs addresses will be given to those of the memory rank 32B. In such kind of the address distribution, ending addresses which each memory rank corresponds to are defined. The conventional method described above is to determine the memory rank the given address 54 belongs to by comparing the given address and the ending address. Of course, in this application there will be eight memory ranks for the four memory modules, and there will be eight ending addresses. Eight subtraction modules are needed to compare the given addresses and each ending address.

However, in the prior art both the implementation of the subtraction module by hardware and by software programs of the north bridge circuit 26A do not have high efficiency.

In the hardware method, implementing a subtraction module to subtract one binary number by another can make one number its complement to form a negative one, and then sum this negative number with the other. When a binary adder does summation between two binary numbers, it starts on the Least Significant Bit (LSB) of the two numbers. After the LSB is added, generating a carry bit, the second significant bit is added with the carry bit. Similarly, the following bits are added in turn.

When two binary numbers are added, the corresponding bits of two numbers as well as the carry bit from the previous calculation are needed to obtain the results. Thus, time during the addition is the accumulation of operation time of each digit. The more bits two binary numbers to be added have, the more time the addition will take. This characteristic of the addition is obvious in the prior art. If the subtraction module in FIG. 3 does subtraction to compare the magnitude of address 54 and each ending address 46A to 46D, it takes most of the time on subtraction, lacking efficiency of address decoding and operation of computer 10.

SUMMARY OF INVENTION

The claimed invention relates to a memory address decoding method for determining if a given address is located in one of a plurality of sections. Each section has a plurality of memory units and each memory unit has a unique corresponding address. The corresponding addresses use the binary system. The claimed method comprises: building at least one bit-pattern for each section from the corresponding addresses respectively; and comparing if at least one comparative bit of the given address matches any of the bit-patterns so as to determine that the given address is located in one of the sections based on the comparison.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
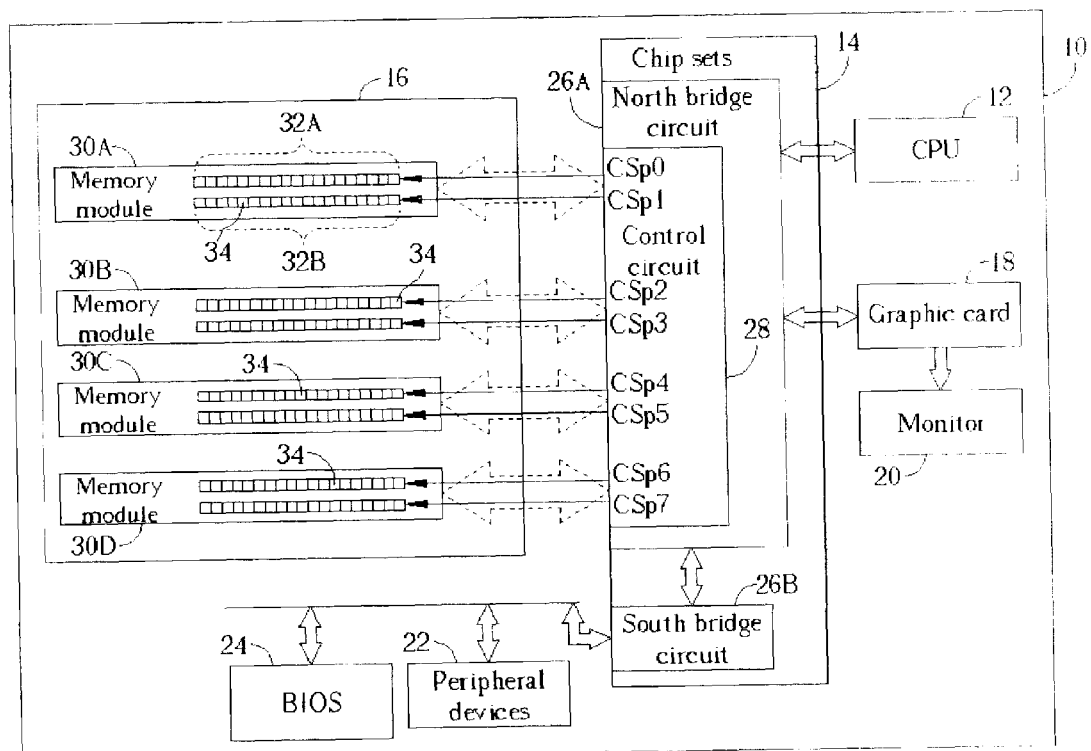
FIG. 1 illustrates function blocks of a conventional computer.
Figure 2:
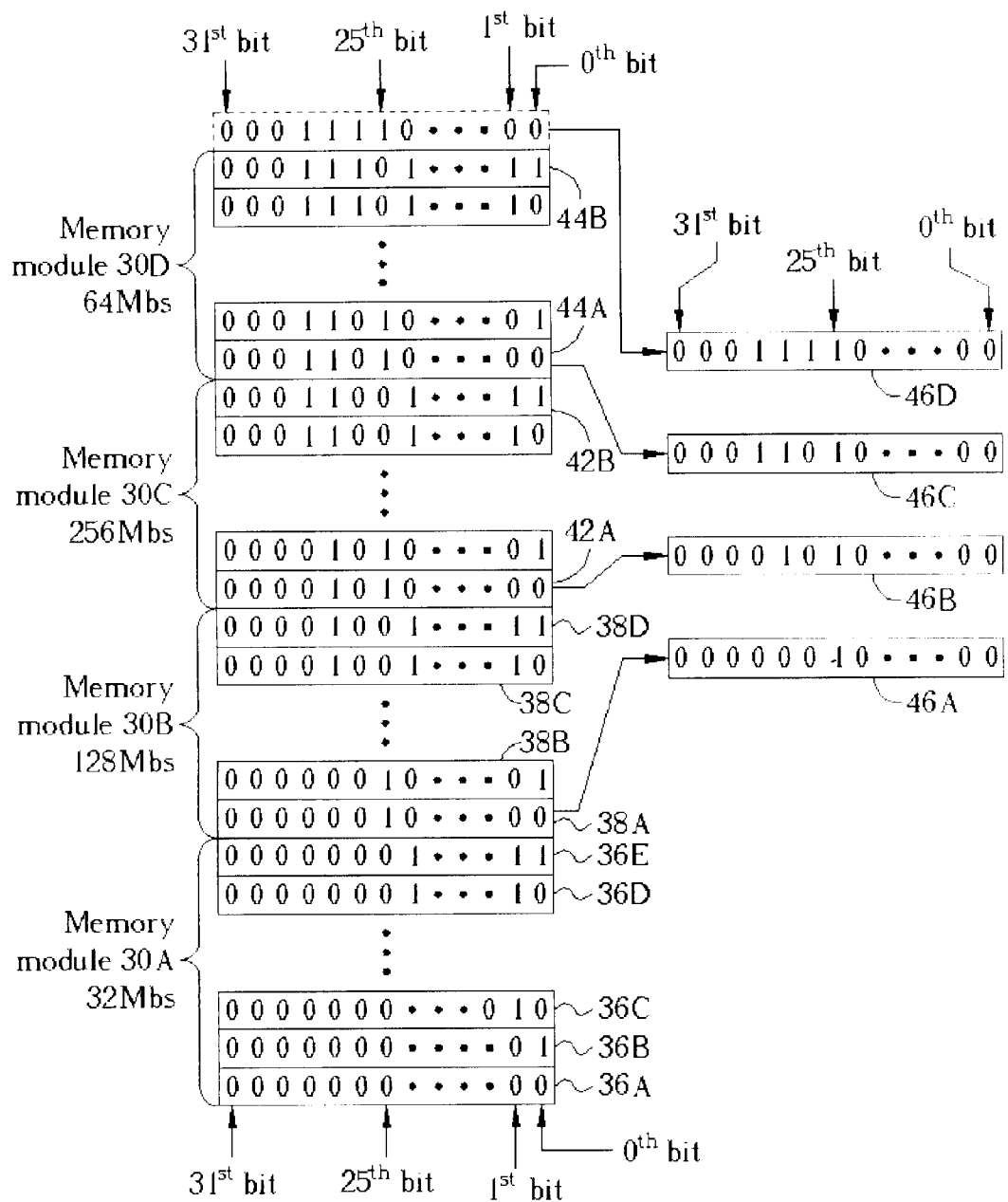
FIG. 2 illustrates the computer in FIG. 1 assigning addresses to each memory unit.
Figure 3:
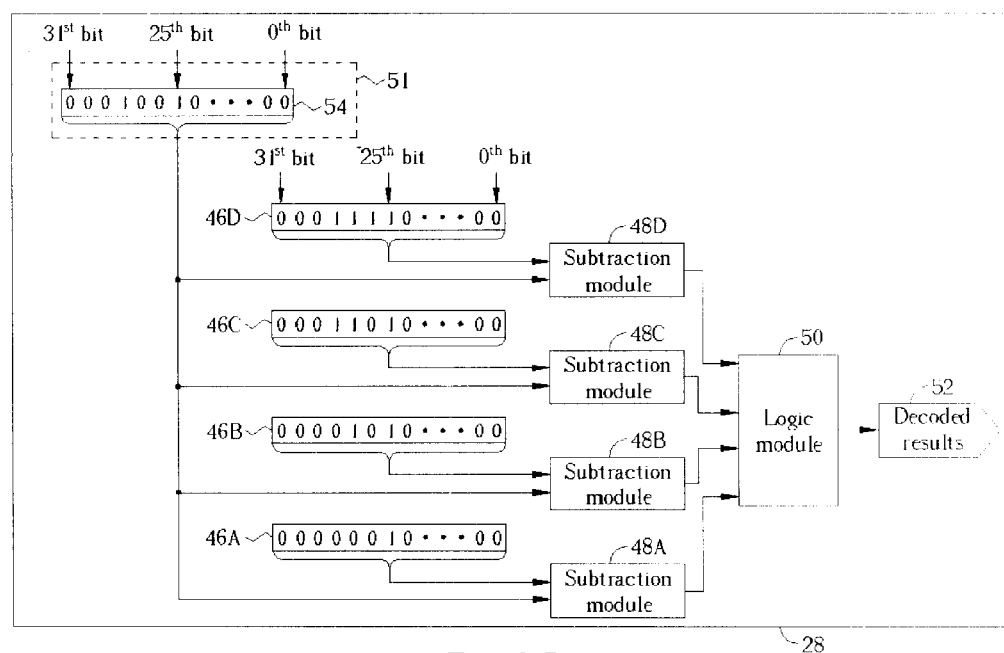
FIG. 3 illustrates the computer in FIG. 1 decoding an address in a conventional way.
Figure 4:
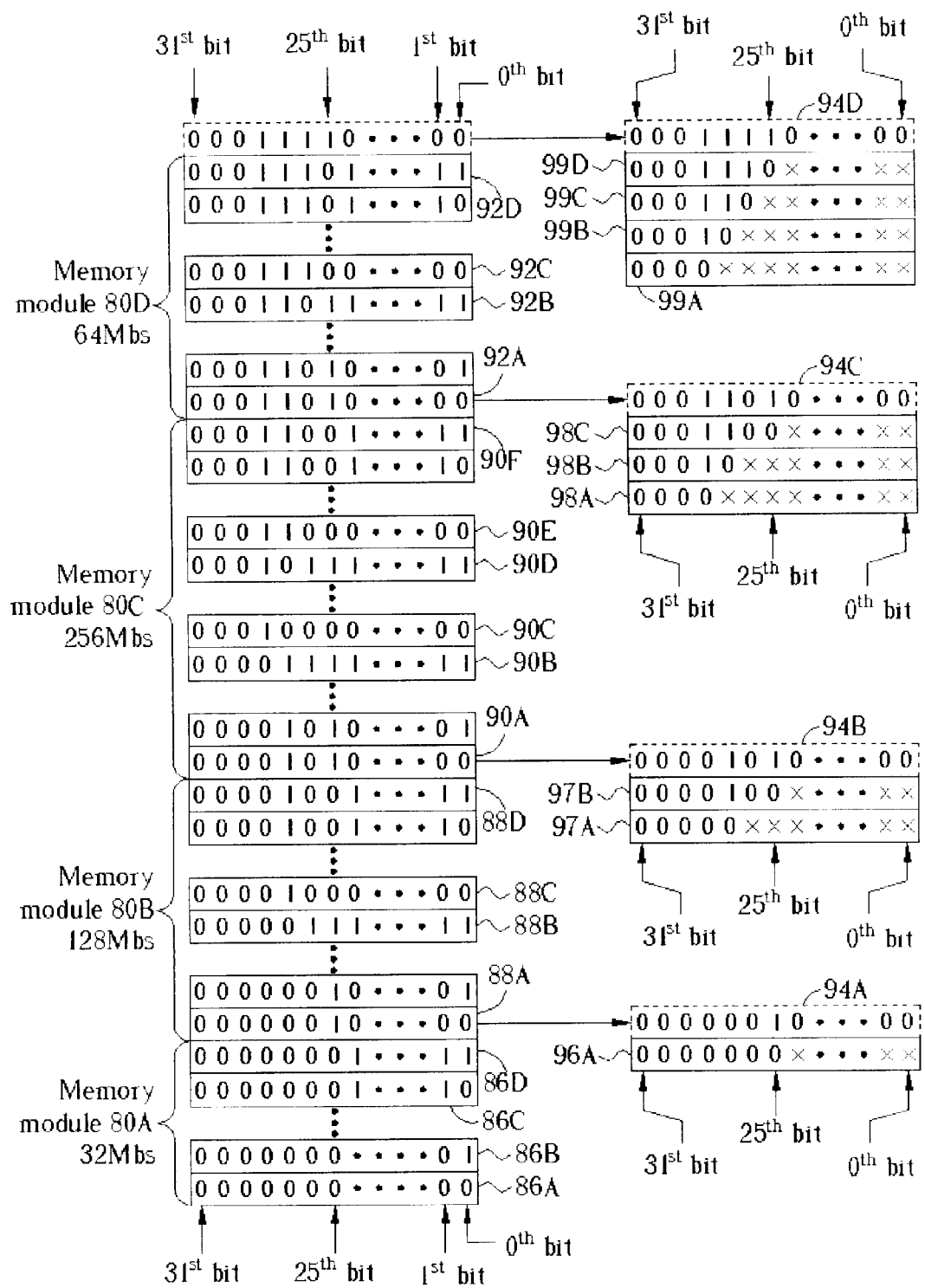
FIG. 4 illustrates the computer in FIG. 1 assigning addresses to each memory unit and related bit patterns.

Please refer to FIG. 4 (also FIG. 1). FIG. 4 illustrates the control circuit 28 of the present invention assigning addresses to each memory unit 34 of the memory 16. For convenience of comparison, the memory module 80A to 80D are assumed to have $2^{25}, 2^{27}, 2^{28}$, and $2^{26}$ memory units. Respective capacities of the memory are 32 Mbs, 128 Mbs, 256 Mbs, and 64 Mbs. In FIG. 4, each memory unit corresponds to a 32-bit address (the 0th is the Least Significant Bit and the 31st bit is Most Significant Bit).

Because the control circuit 28 takes the total memory unit of each memory module as one large unit, the corresponding address 88A of first memory unit in memory module 80B is the result of address 86D increased by 1, becoming "0 . . . 010 . . . 0" (only the 25th bit is "1"). Addresses of other memory units in the memory module 80B are the values sequentially increased from address 88A. They are address 88B, address 88C, and address 88D, expressed as "0 . . . 01001 . . . 1" (the 0th and the 24th bits are "1", and the 27th bit is "1") and representing the $(2^{25}+2^{27})$th memory unit counted from address 86A. Similarly, the address 90A first assigned in memory module 80C is the value of address 88D increased by 1, becoming "0 . . . 01010 . . . 0" (only the 25th and 27th bits are "1"). The assigned addresses of other memory units in the memory module 80C are the values sequentially increased from address 90A. The last memory unit, address 90F, is increased to the value "00011001 . . . 1" (the 0th to the 24th bits, the 27th and the 28th bits are "1"), representing the $(2^{25}+2^{27}+2^{28})$th memory unit counted from address 86A. The first address 92A of the memory module 80D (the address of the smallest value) is the value of address 90F increased by 1 becoming "00011010 . . . 0" (the 25th, the 27th, and the 28th bits are "1"). The address 92D that the last memory unit of memory module 80D corresponds to is increased to "00011101 . . . 1" (the 0th to 24th bits, and the 26th to the 28th bits are "1").

The present invention in FIG. 4 can define the ending addresses 94A to 94D by the first and the last addresses of each memory module. The addresses smaller than the ending addresses 94A (that is address 88A) belong to memory module 80A. The addresses smaller than the ending addresses 94B (that is address 90A) may belong to memory modules 80A, 80B. The addresses smaller than the ending address 94C (that is address 92A) may belong to memory modules 80A to 80C. The ending address 94D can be calculated by adding 1 to address 92D. The address smaller than the ending address 94D may belong to one memory module of memory modules 80A to 80D. In other words, each ending address 94A to 94D can respectively divide the memory unit of the memory 66 into two sections. For example, ending address 94A separates two sections: the memory module 80A and memory modules 80B to 80D. If a given address is smaller than the ending address 94A, it belongs to the former section. Otherwise, if the given address is not smaller than ending address 94A, it belongs to the latter section. Similarly, ending address 94C separates two sections: the memory modules 80A to 80C and the memory module 80D. If a given address is smaller than the ending address 94C, it belongs to the memory module 80A, 80B, or 80C. Otherwise, it belongs to the memory module 80.

Observing the divided sections from addresses 94A to 94D, one can find that addresses of each section have some common pattern. For example, the addresses in the section where all addresses are smaller than address 94A increase from address 86A to address 86D. Though the 0th to the 24th bits of the above addresses may be "0" or "1", the 25th to the 31st bits must be "0". This characteristic derives one bit pattern 96A. The bits marked as "X" in bit pattern 96A (and the other bit patterns in the following) represent an unfixed value "1" or "0". As shown in bit pattern 96A, the 0th to the 24th bits marked as "X" indicate that when addresses of memory module 80A increase from address 86A to address 86D, the 0th to the 24th bits will change between "0" and "1". However, the 25th to the 31st bits of bit pattern 96A have a fixed value "0". These characteristics are evident by observing addresses 86A to 86D. In other words, when addresses of the memory module 80A increase from address 86A, they will not be carried to the 25th bit (it will not be increased to the ending address 94A). Thus, the bit pattern 96A represents the common pattern of the memory module 80A, in which the 25th to 31st bits are "0". Equivalently speaking, the fixed bits of bit pattern 96A are the common parts of the addresses of memory module 80A.

Similarly, the memory modules 80A and 80B will become one section after separation by the ending address 94B. All addresses of the memory module 80A and 80B are smaller than the ending address 94B. In the section of memory modules 80A and 80B, all addresses increasing from address 86A and finally reaching address 88D form an address sequence. Observing the address sequence, one can find that the address sequence increases from address 86A, first to address 88B ("0 . . . 01 . . . 1", the 0th to the 26th bits are "1"), then to address 88C ("0 . . . 010 . . . .0", only the 27th bit is "1"), and finally to address 88D. When the address sequence increases from address 86A to address 88B, the 0th to the 26th bits will change between "0" and "1", but the 27th to the 31st bits maintain fixed value "0", as shown in bit pattern 97A. When the address sequence increases from address 88C to address 88D, the 0th to the 24th bits of each address will change, but the 31st to the 25th of them are fixed as "0000100", as shown in bit pattern 97B. Further, when the addresses in memory modules 80A and 80B, where all addresses are smaller than address 88C, increase from address 86A to address 88B, the digit "1" located in the 27th bit of address 88C in fact is the digit "1" located most close to the MSB of the ending address 86A. Because the address sequence increases from address 86A to 88B, it must not be carried to the 27th bit. Thus, in bit pattern 97A, the 27th to the 31st bits must be "0". Similarly, when the address sequence keeps increasing from address 88C to address 88D, each address must not be carried to the 25th bit. This results in fixed digits from the 31st bit to the 24th bit in bit pattern 97B. In other words, the addresses smaller than the ending address 94B may match bit pattern 97A (address 86A to 88B) or bit pattern 97B (address 88C to 88D). Therefore, addresses belonging to bit pattern 97A or bit pattern 97B indicate that they are smaller than the ending address 94B.

To conclude the above description, what bit pattern an address sequence belongs to can be defined from the bits expressed as "1" in the ending address. In the address sequence in which the addresses are smaller than the ending address 94A, each address must not be carried to "1" in the 25th bit of the ending address 94A, forming bit pattern 96A. In the address sequence in which the addresses are smaller than the ending address 94B, each address must not be carried to "1" in the 27th bit of the ending address 94B, forming bit pattern 97B.

Similarly, in the section where addresses are smaller than the ending address 94C (they are the all addresses in the memory modules 80A, 80B, and 80C), the address sequence increases from address 86A to address 90B forming bit pattern 98A, increases from address 90C to address 90D forming bit pattern 98B, and from address 90E to address 90F forming bit pattern 98C. In other words, this is as for three values of "1" respectively located in the 28th, 27th, and 25th bits of the ending address 94C. The addresses not carried to the 28th bit during increasing from address 86A to address 90B belong to bit pattern 98A, those not carried to the 27th bit during increasing from address 90C to address 90D belong to bit pattern 98B, and those not carried to the 25th bit during increasing from address 90E to address 90F belong to bit pattern 98C. The addresses matching one of the bit patterns 98A, 98B, and 98C represent that they are smaller than the ending address 94C.

According to the same rules above, bit patterns 99A to 99D can be derived by four bits "1" located at the 28th, 27th, 26th, 25th bits of the ending address 94D. In the address sequence where the addresses are smaller the ending address 94D, the addresses increasing from address 86A to address 90B and not carried to the 28th bits belong to bit pattern 99A. Those increasing from address 90C to address 90D and not carried to the 27th bits belong to bit pattern 99B. Those increasing from address 90E to address 92B ("0001101 . . . 1"), and not carried to the 26th bits belong to bit pattern 99C. Those increasing from address 92C to address 92D and not carried to the 25th bits belong to bit pattern 99D. In summary, each ending address corresponds to one or more bit patterns (the number of bit patterns is the same as the number of bits "1" in the ending address). In the present invention, the rules described above are used to decode addresses in order to define what memory module a given address belongs to.

Figure 5:
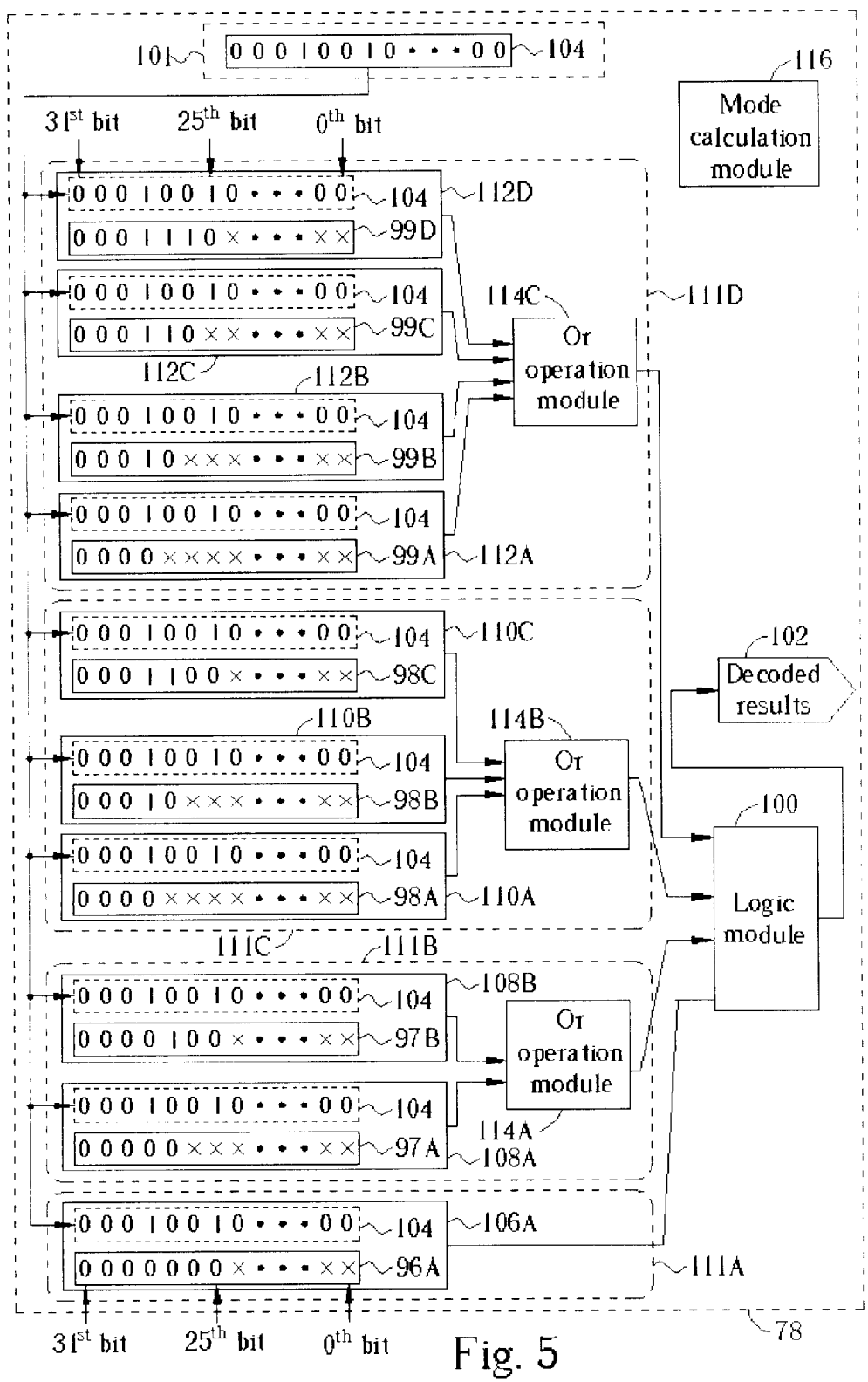
FIGS. 5–6 illustrate the control circuit in FIG. 1 implementing bit pattern comparison.

Please refer to FIG. 5 (and also FIG. 4). FIG. 5 illustrates the control circuit 28 of the present invention implementing bit pattern comparison. The control circuit 28 comprises an access module 101, a mode calculation module 116, a logic module 100, and a plurality of comparison modules 111A to 111D. Each comparison module comprises one or more comparison units (such as comparison units 106A, 1010 to 1011, 110A to 110C and 112A to 112D in FIG. 5) and an "Or operation module" (such as "Or operation module" 114A to 114C in FIG. 5). To continue the example in FIG. 4, FIG. 5 illustrates decoding of the present invention when allocation of memory is as shown in FIG. 4 (i.e. capacities of the memory modules 80A to 80D is 32 Mbs, 128 Mbs, 256 Mbs, and 64 Mbs respectively). The access module 101 is to receive and store a given address 104 when the control circuit 28 assigns different addresses to different memory units of the memory 66 after the computer 60 starts. The mode calculation module 116 calculates corresponding ending addresses of each memory module and their bit patterns. The comparison modules and the logic module 100 decode the given address 104 to determine the memory module the given address 104 belongs to. The logic module 100 outputs the decoded result 102.

As discussed above, an ending address could correspond to one or more bit patterns. If a given address matches one bit pattern it means the given address is smaller than the ending address (or not larger than the largest address of the memory module). If a given address does not match all bit patterns the ending address corresponds to, it means the given address is not smaller than the ending address. Functions of each comparison unit of the control circuit 28 are used to compare the given address 104 and each bit pattern. For example, the comparison unit 106A compares the given address 104 and the bit pattern 96A that address 94A corresponds to (see FIG. 4). The comparison units 1010 and 1011 respectively compare the given address 104 and the bit patterns 97A, 97B that address 94B corresponds to. The comparison units 110A and 110C respectively compare the given address 104 and the bit patterns 98A to 98C that address 94C corresponds to. The comparison units 112A to 112D respectively compare the given address 104 and the bit patterns 99A to 99D that address 94D corresponds to. The comparison module determines if the given address 104 is smaller than the ending address 94D and outputs the corresponding results from the "Or operation module".

Figure 6:
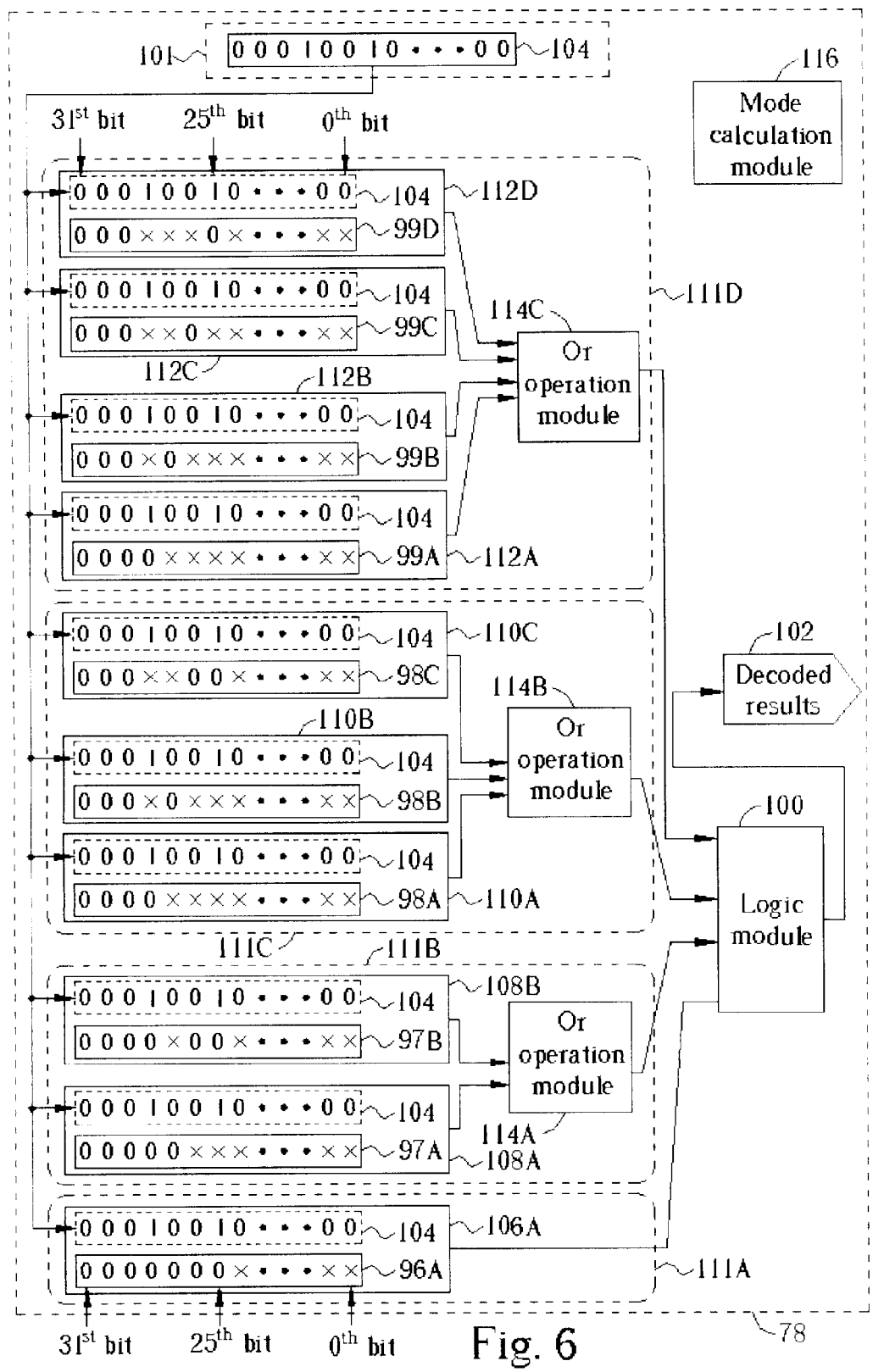

When comparison units compare the given address 104 and bit patterns, the fixed bits of the bit patterns and the corresponding bits of the given address 104 are compared. If the fixed bits of one bit pattern and each corresponding bit of the given address 104 are the same, it means the given address 104 matches the bit pattern. For example, the comparison unit 106A compares the given address 104 and bit pattern 96A. Because bit pattern 96A has the fixed bits from the 25th to the 31st bits, which are all "0", if the 25th to the 31st bits of the given address 104 are "0", it means that the given address 104 belongs to bit pattern 96A. Then, the comparison unit 106A will send a logic result of "True" to indicate this fact. Otherwise, if one of the 25th to the 31st bits of the given address 104 is not "0", the given address 104 does not belong to bit pattern 96A, and the comparison unit 106A sends a logic result of "False" to indicate that the given address and the bit pattern are different. Similarly, in the comparison unit 110A, the 28th to the 31st bits of bit pattern 98A are "0". If the 28th to the 31st bits of the given address 104 are "0", the comparison unit 110A will send a logic result of "True" to the Or operation unit 114B. Otherwise, if one of the 28th to the 31st bits of the given address 104 is not "0", the comparison unit 110A sends a logic result of "False" to the Or operation unit 114B, indicating that the given address and the bit pattern are different. In FIG. 6, suppose that address 104 is "00010010 . . . 0" (only the 25th bit and the 28th bit are "1"). After the address 104 is compared with each bit pattern in each comparison unit, the results of comparison units 106A, 1010, and 1011 are "False", "False", and "False", the results of comparison units 110A, 110B, and 110C are "False", "True", and "False", and the results of comparison units 112A to 112D are "False", "True", "False" and "False".

If the given address 104 matches one bit pattern that the ending address corresponds to, the given address 104 is smaller than the ending address (or not larger than the largest address of some memory module), so the results of each comparison unit can be integrated by an "Or" operation module. As in FIG. 5, two comparison units 1010 and 1011 of comparison module 111B compare the given address 104 and two bit patterns 97A and 97B that the ending address 94B corresponds to. The result of the "Or" operation represents if the given address 104 is smaller than the ending address 94B. Similarly, in the comparison unit 111D, comparison units 112A to 112D respectively compare the given address 104 and four bit patterns 99A to 99D that the ending address 94D corresponds to. The results of the Or operation unit 114C represent if the given address 104 is smaller than the ending address 94D. Of course, the ending address 94A only corresponds to bit pattern 96A. The results of comparison unit 106A and of comparison module 111A directly show if the given address 104 is smaller than the ending address 94A. Taking the given address 104 "00010010 . . . 0" in FIG. 5 as an example, the result "False" of comparison unit 106A means the given address 104 is not smaller than the given address 94A. In the comparison module 111B, after the "Or" operation for two "False" results of both comparison units 1010 and 1011, the Or operation module still outputs "False" meaning that the given address 104 is not smaller than the ending address 94B. In the comparison module 111C, three results, "False", "True", and "False", of the comparison units 110A to 110C are Or operated by the Or operation module 114B, and the Or operation module 114B outputs "True", meaning that the given address 104 matches bit pattern 98B that the ending address 94C corresponds to. Similarly, four results, "False", "True", "False", and "False" of comparison units 112A to 112D are Or operated by the Or operation module 114C, and the Or operation module 114C outputs "True", meaning that the given address 104 is smaller than the ending address 94D. According to the outputs of the Or operation modules 111A to 111D, the logic module 100 can easily determine the memory module the given address 104 belongs to and generate the decoded result 102. In addition, since the given address 104 is not smaller than the ending addresses 94A and 94B but smaller than the ending addresses 94C and 94D, the given address 104 is determined to belong to memory module 80C.

The flow of address decoding in the present invention is described below. After the computer 10 starts (see FIG. 1), the control circuit 28 scans each memory module in the memory 16 to get the total memory units of each memory module, and assigns different addresses to different memory units. After assigning addresses, the mode calculation module 116 determines the ending addresses that each memory module (or memory ranks) corresponds to. Each ending address derives each corresponding bit pattern for comparison units. During operation of the computer 10, when the CPU 12 (or other circuits) accesses memory unit of a given address, control circuit 28 decodes addresses according to the operated results of each comparison unit, with the Or operation module and logic module 100 determining the memory module (or memory ranks) that the given address belongs to. In the present invention, the mode calculation module 116, each comparison module, comparison units, the Or operation module, and the logic module 100 of the control circuit 28 can be implemented by hardware circuits or software codes executed by microprocessors. Of course, functions of different modules can be implemented by different means. For example, functions of the mode calculation module 116 can be implemented by the control circuit 28 executing some section of codes in the BIOS system 24 when the computer 10 starts. Each comparison unit can be implemented by hardware circuits.

Because the present invention decodes addresses by comparing them with bit patterns, the procedure is fast and efficient. Because addresses and each comparison unit are compared by the bits of fixed values in bit patterns and the corresponding bits in the given address 104, these bits can be compared in parallel, with compared results outputted quickly. For example, in FIG. 5 the comparison unit 106A simultaneously checks if the 25th to 31st bits of the given address 104 are "0", performs a comparison operation between them, and outputs compared results. By the time when each comparison unit simultaneously completes the comparison procedure to get the first compared results, the first results "And" operated obtaining the second compared results and the Or operation units in the comparison modules performing the "Or" operation on the second compared results to determine if the given address is smaller than an ending address is about the time of comparison of one unit, increased by the time of an "And" operation and increased by the time of an "Or" operation by a comparison module. The three operations mentioned above are quite simple and can be implemented by a single logic gate, so the present invention is able to complete the total operation of a comparison module very quickly.

In comparison, the prior art uses subtraction to decode addresses, and when each bit is undergoing addition, it needs to wait for carrying bits, so the consumed time is a total of addition time of all bits. Therefore, the present invention can decode addresses faster and more efficiently.

In fact, the bit patterns of the present invention can be further simplified. As for this case, please refer to FIG. 6 (also FIG. 5). FIG. 6, the same with FIG. 5, illustrates function blocks in which the control circuit 28 of the present invention decodes addresses. The devices and blocks with the same labels in FIG. 5 and FIG. 6 have the same functions. The difference between FIG. 6 and FIG. 5 is that in FIG. 6 bit patterns of each comparison unit are further simplified. For example, in the bit patterns 97A and 97B generated by address 94B, the comparison unit 1011 need not determine if the 27th bit of address 104 is "1". In other words, although in FIG. 5 the comparison unit 1011 has to compare the 25th to 31st of the given address 104 and determine if they are "0000100", in FIG. 6 the comparison unit 1011 only has to determine if the 25th bit, the 26th, and the 28th to 31st bits are "0". The reason for such simplification is that the comparison unit 1010 has checked if the 27th bit of given address 104 is "0", and since the compared results of comparison units 1010 and 1011 will further undergo an "Or" operation by the Or operation module, the comparison unit 1011 need not check the 27th bit. Please consider the following Boolean equations:

$$A*B + A*B'*C = A*B*(1+C) + A*B'*C$$
$$= A*B + A*B*C + A*B'*C$$
$$= A*B + A*(B+B')*C$$
$$= A*B + A*C$$

where A, B and C are three Boolean variables, B' represents the conjugate of B, "*" represents an "And" operation, "+" represents an "Or" operation, and "1" represents "True". In the above equations, the variable A represents if the 28th to 31st bits of the given address 104 are "0" (A is True if they are all "0", otherwise A is False). The variable B represents if the 27th bit of the given address 104 is "0" (B is True if it is "0"). In FIG. 5, the result of comparison between the given address 104 and bit pattern 97A by the comparison unit 1010 is A*B. The variable C represents if the 25th and the 26th bits of the given address 104 are "0" (C is True if they are all "0"). Therefore, the result of comparison between the given address 104 and bit pattern 97B by the comparison unit 1011 is expressed by A*B*C. (Because B represents if the 27th bit of the given address 104 is "0", B' represents if the 27th bit of the given address 104 is "1"). In the comparison module 111B, results of the comparison units 1010 and 1011 after operation of the Or operation module 114A can be expressed by "A*B+A*B'*C". From the above equation, "A*B+A*B'*C" can be simplified to "A*B+A*C". That is, though in FIG. 6 the comparison unit 1011 does not check the 27th bit of the given address 104, the final result will be the same as the result of the Or operation module 114A in FIG. 5.

In each bit pattern corresponding to the same ending address, the bit "1" in some bit pattern must be carried by the bit "0" in another bit pattern. Thus, the bit "1" in each bit pattern must not be checked during the simplification procedure. In each bit pattern corresponding to the same ending address, the bit "1" in some bit pattern must be bit "0" in another bit pattern. For example, as shown in FIG. 4, in three bit patterns 98A to 98C corresponding to the ending address 94C, because the 27th bit of bit pattern 98A increased by 1 is carried to the 28th bit of bit pattern 98B (address 90B is increased to address 90C), the 28th bit of bit pattern 98A must be "0". In implementing the present invention, since in the same comparison module 111C comparison unit 110A has checked if the 28th bit of the given address 104 is "0" or not, comparison units 110B and 110C can neglect checking the 28th bit of the given address 104. As shown in FIG. 6, similarly, the 27th bit "1" of bit pattern 98C is obtained from the 27th bit "0" of bit pattern 98B when address sequence increases from 90D to 90E. As shown in FIG. 6, each comparison unit need not check the specific bit of the given address after simplification of the present invention.

Figure 7:
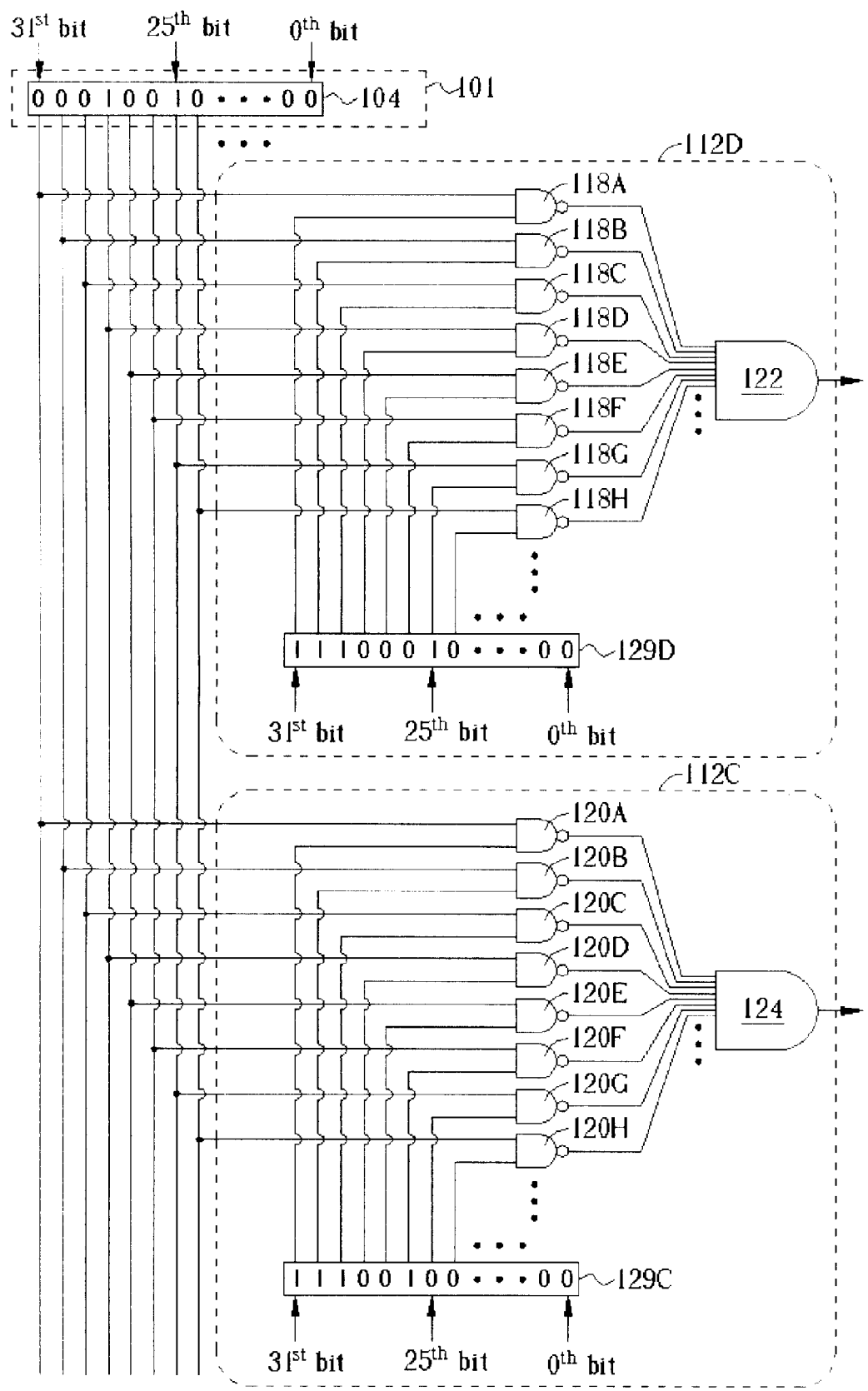
FIG. 7 illustrates function blocks of the comparison unit of the embodiment in FIG. 6.

Please refer to FIG. 7 (also FIG. 6). FIG. 7 illustrates function blocks of the comparison unit 112C and 112D in FIG. 6. In the embodiment of FIG. 7, each comparison unit comprises a plurality of "Nand" gates (FIG. 7 shows "Nand" gates 1110 to 118H and 120A to 120H as representative) and an "And" gate (Comparison units 112C and 112d in FIG. 7 have "And" gates 122 and 124 respectively). Each "Nand" gate is for "Nand" operation of one bit of the given address 104 and one corresponding bit of a mask (129C or 129D). The "And" gates are used for "And" operation of the output of each "Nand" gate to obtain comparison result of the comparison unit. First, from FIG. 6, after the present invention is simplified, each comparison unit has only to check if some specific bits of the given address 104 are "0". The masks used by each comparison unit of the present invention will mark these specific bits. For example, comparison unit 122D in FIG. 6 is to compare the given address 104 and bit pattern 99D. Suppose comparison unit 122D in FIG. 6 checks if the 25th and 29th to 31st bits are "0". Therefore, in FIG. 7, the 25th and the 29th to the 31st bits of mask 129D of comparison unit 112D are all "1". Other bits that do not need comparing with other bits are represented by "0" in mask 129D. Thus, comparison unit only performs a "Nand" operation between each bit in the corresponding mask and each corresponding bit of the given address 104. The bits that need not be checked in the given address 104 will be masked by the mask. Further taking comparison unit 112C as example, the comparison unit 112C is to check the 26th and the 29th to the 31st bits of address 104 (Please refer to bit pattern 99C of FIG. 5). Therefore, bits of "1" of the 26th and the 29th to the 31st bits in the corresponding mask 129C of comparison unit 112C are marked to be checked. Bits of "0" of the other bits in mask 129C mean that their corresponding bits in the given address 104 need not be checked. In addition, to check if some bit is "0" is only to do and "Inversion" operation for the bit. If the bit is "0", the inversion of the bit becoming "1" (True) can mean the bit is really "0".

When performing the "And" operation in applying masks and the "Inversion" operation in checking bits, each comparison unit can check the given / 104 and bit pattern with "Nand" gates. For example, as shown in FIG. 7, the "Nand" gates 1110 to 118H in the comparison unit 112D are used to perform a "Nand" operation on the 31st to the 24bits of the given address 104 and the 31st to 24th bits of the mask 129D. For "Nand" gates 118D, 118E, and 118F, because the 26th to 28th bits of the mask 129D are "0", the results of "Nand" gates 118D to 118F are "True" regardless of the 28th to 26th bits of the given address 104. In other words, the 26th to 28th bits of mask 129 masks the 26th to 28th bits of the given address 104 so that comparison unit 112D will not check these bits. In contrast, for "Nand" gates 1110 to 118C and 118G, the 31st to the 29th bits and the 25th bit in mask 129D are "1", and outputs of these "Nand" gates are decided by the 31st to the 29th bits and the 25th bit of the given address 104. In other words, the comparison module 112D will in reality affect the output of comparison unit 112D. To follow the example of FIG. 6, FIG. 7 supposes that the given address 104 be "00010010 . . . 0" (only the 25th and the 28th bits are "1"). In the example, the 31st to the 29th bits in the given address 104 are "0", resulting in outputs of "Nand" gates 1110 to 118C being "True". However, because the 25th bit of the given address 104 is "1", the output of "Nand" gate is "False" and also the output of "And" gate 122 is "False". The output "False" of the "And" gate means that the comparison unit 112D determines that the given address 104 does not match bit pattern 99D.

In contrast, in the comparison unit 112C, because the 31st to the 29th bits and the 26th bit of mask 129C are "1", and the 31st to the 29th bits and the 26th bit of the given address are "0", outputs of "Nand" gates 120A to 120C and 120F are "True". The other "Nand" gates will output "True" due to the value "0" of the mask 129C, making the final output of the "And" gate 124 be "True". The result "True" of the "And" gate 124 represents that the given address 104 matches bit pattern 99C that comparison unit 112C in FIG. 6 corresponds to. Of course, the comparison unit of FIG. 7 is only one possible embodiment. For example, functions of "Nand" gates and "And" gate of FIG. 7 can be implemented by hardware circuits or by software codes. The main purpose of FIG. 7 is to show the process of fast comparison of bit pattern in the present invention. Because each bit can be checked in parallel, the results of comparison of bit pattern can be obtained in a short time. If FIG. 7 is implemented by logic gates, no matter how many bits of "1" one comparison unit has, each comparison will output in two gate delay periods. In addition, as mentioned above, the mode calculation module 116 in the control circuit 28 will calculate the bit pattern that each comparison unit corresponds to when the computer is starting. However, the mode calculation module 116 can also directly calculate masks that each comparison unit corresponds to and implement functions of comparison units in FIG. 7.

Figure 8:
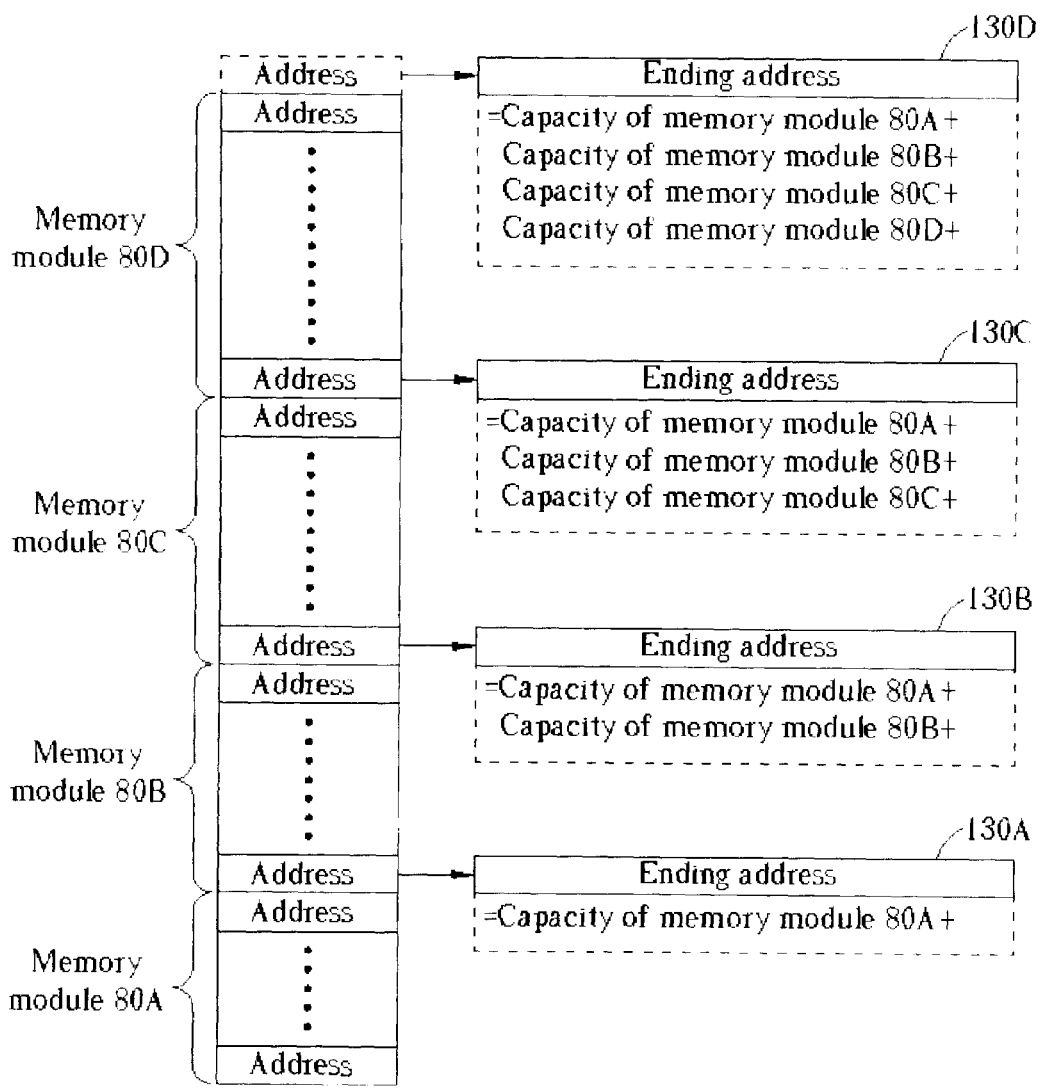
FIG. 8 illustrates the relationship between the memory modules in FIG. 1 and their corresponding addresses.

From the above discussion on FIG. 4A to FIG. 7, either the bit pattern of FIG. 5 or the simplified bit pattern of FIG. 7 can be derived by the ending address of FIG. 4. Clearly speaking, the bit pattern or the simplified bit pattern is derived by bits "1" of the ending address. Please refer to FIG. 8. FIG. 8 illustrates the derivation of each ending address. As shown in FIG. 8, in each ending address 130A to 130D, the smallest ending address 130A equals a binary value of capacity of the memory module 80A. This means that each address belonging to the memory module 80A is smaller than the ending address 130A. The ending address 130B equals the total capacity of memory modules 80A and 80B. This represents that the addresses each memory unit of these two memory modules correspond to are smaller than the ending address 130B. Similarly, the largest ending address 130D equals the total capacity of memory modules 80A to 80D.

In current digital technology, capacity of each memory module is by powers of 2. The memory capacity expressed in the binary system is by bits of "1" and bits of "0". In the ending address formed by accumulation of different capacities of different memory modules, the number of position of bits "1" in each ending address will be changed. In the ending address 130A, because capacity of only one memory module is accumulated, there is only one bit of "1" in the ending address 130A. In the ending address 130B, the capacity of memory modules 80A and 80B are accumulated, so there are one or two bits in the ending address 130B that are "1". For example, in the example of FIG. 4, because memory modules 80A and 80B have capacity of 32 million ($2^{25}$) and 128 million ($2^{27}$) bits, there are two bits of "1", the 25th bit and the 27th bit respectively, in the ending address 94B. Thus, the ending address 94B has two corresponding bit patterns. If the memory modules 80A and 80B in FIG. 8 have the same memory capacity and the capacity is in the form of $2^N$, there is only one bit of "1" in the ending address 130B, corresponding to a single bit pattern. Similarly, the ending address 130C accumulates capacity of the memory module 80A to 80C, so there are one to three bits "1" in the ending address 130C. The ending address 130D may have one to four bits of "1", so there are one to four bits in the bit pattern that address 130D corresponds to. Of course, in some special case, some ending addresses have no bits of "1". This will be the case, for example, if a user establishes three memory modules in the computer 60 that can be set up for four memory modules. Equivalently, the capacity of one memory module is "0" in four memory modules. The situation in which some ending addresses have no bits of "1" does not affect the discussion of implementation of the present invention.

Figure 9:
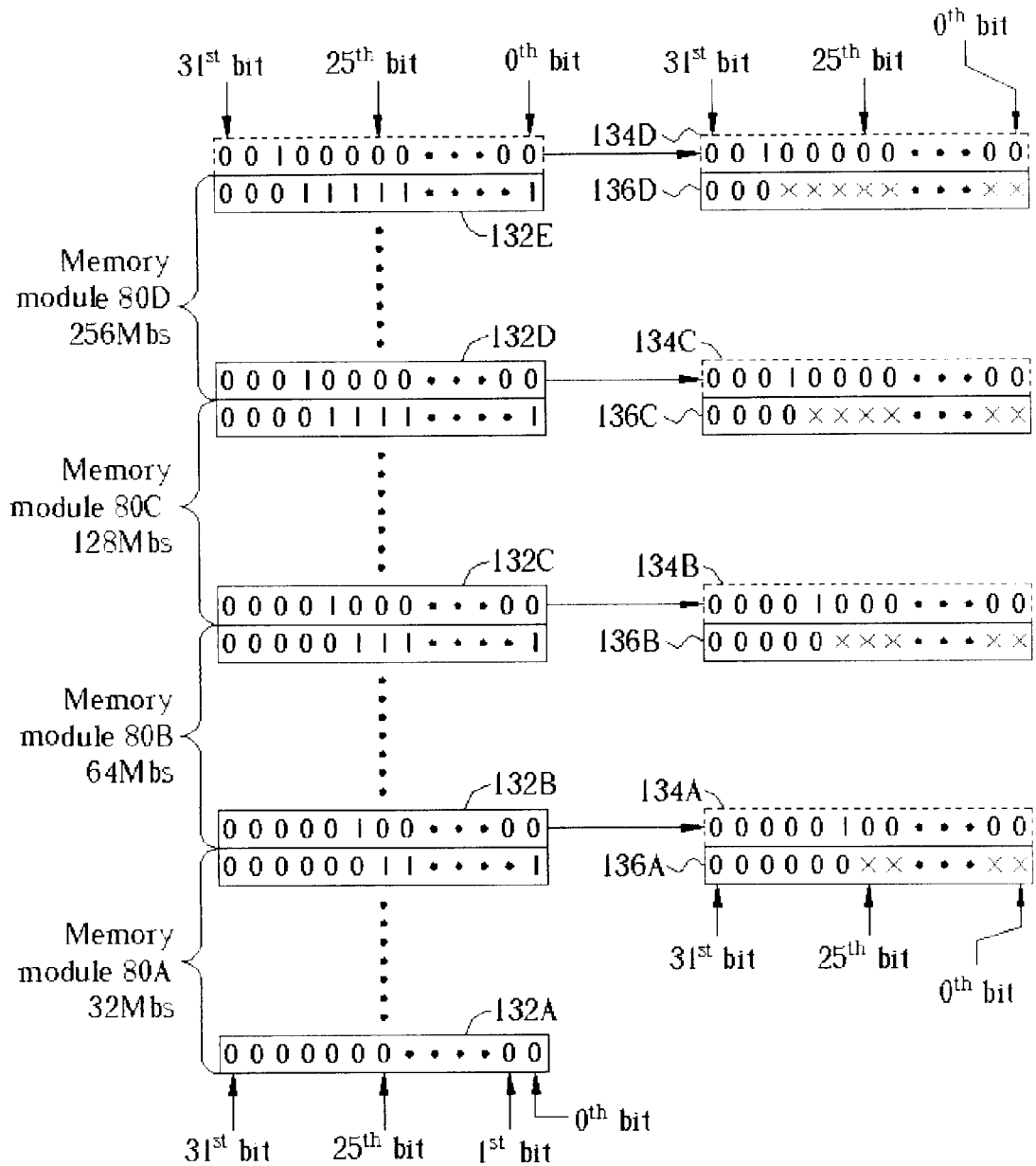
FIG. 9 illustrates the assignment of addresses to each memory unit in different allocation of memory module and related bit patterns.

From the above discussion, when the capacity of each memory module 80A to 80D has a specific relation, each ending address may have only one bit of "1" and correspond to one bit pattern. As for this case, please refer to FIG. 9 and FIG. 10. FIG. 9 illustrates the assignment of addresses to each memory unit in different allocations of memory modules and the related bit patterns.

Figure 10:
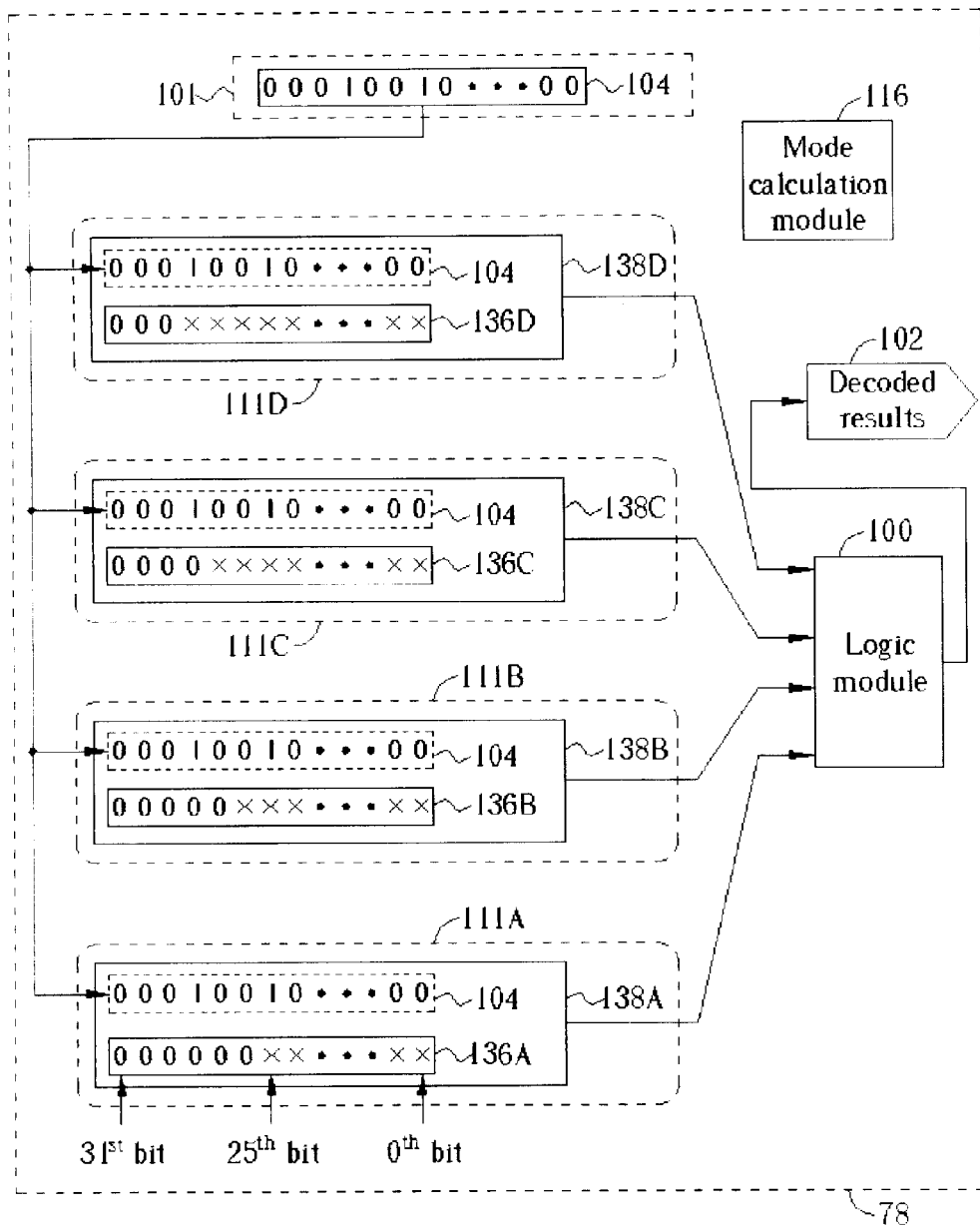
FIG. 10 illustrates the control circuit in FIG. 1 implementing bit pattern comparison of FIG. 9.

FIG. 10 illustrates control circuit 28 implementing functions of address decoding in the case of FIG. 9 in the present invention. For convenience, devices and blocks marked in the same way in FIG. 10 and FIG. 6 have the same functions and operation. In the examples of FIG. 9 and FIG. 10, the memory modules 80A to 80D have memory capacities of 64 Mbs, 64 Mbs, 128 Mbs, and 256 Mbs, respectively. The memory units in each memory module will be assigned to the increased addresses, and the address sequence of each memory unit increases from address 132A to addresses 132B, 132C, 132D, and finally to address 132E, defining the ending addresses 134A to 134D. As shown in FIG. 9, the related property of the memory capacity of each memory module makes ending addresses 134A to 134D one bit of "1" in them. Because memory module 80A and 80B have the same memory capacity and because the total capacity of two memory modules are by power of 2, there is only one bit of "1" in the ending address 134B. Similarly, the total capacity of memory modules 80A to 80C is 256 Mbs, also a power of 2, making ending address 134C have only one bit "1". The 512 Mbs Memory capacity of memory modules 80A to 80D results in the address 134D having only one bit of "1". Since each ending address 134A to 134D has only one bit of "1", the bit pattern which each ending address corresponds to is only one, as bit patterns 136A to 136D marked in FIG. 9. As shown in FIG. 10, under allocation of the memory module in FIG. 9, if comparison modules 111A to 111D in the control circuit 28 respectively implement functions of comparison units 1310 to 138D, and the given address 104 stored in access module 101 are compared with bit patterns 136A to 136D, the logic module 100 generates corresponding decoded result 102 according to output of each comparison module. FIG. 10 supposes that the given address 104 is the same as that of FIG. 5. This address represents correspondingly the ($2^{28}+2^{25}+1$)th memory unit in the memory 66. From FIG. 10, the given address 104 does not match bit patterns 136A to 136C, and only matches bit pattern 136D, meaning that the given address belongs to memory module 80D in the allocation of the memory module in FIG. 9.

Figure 11:
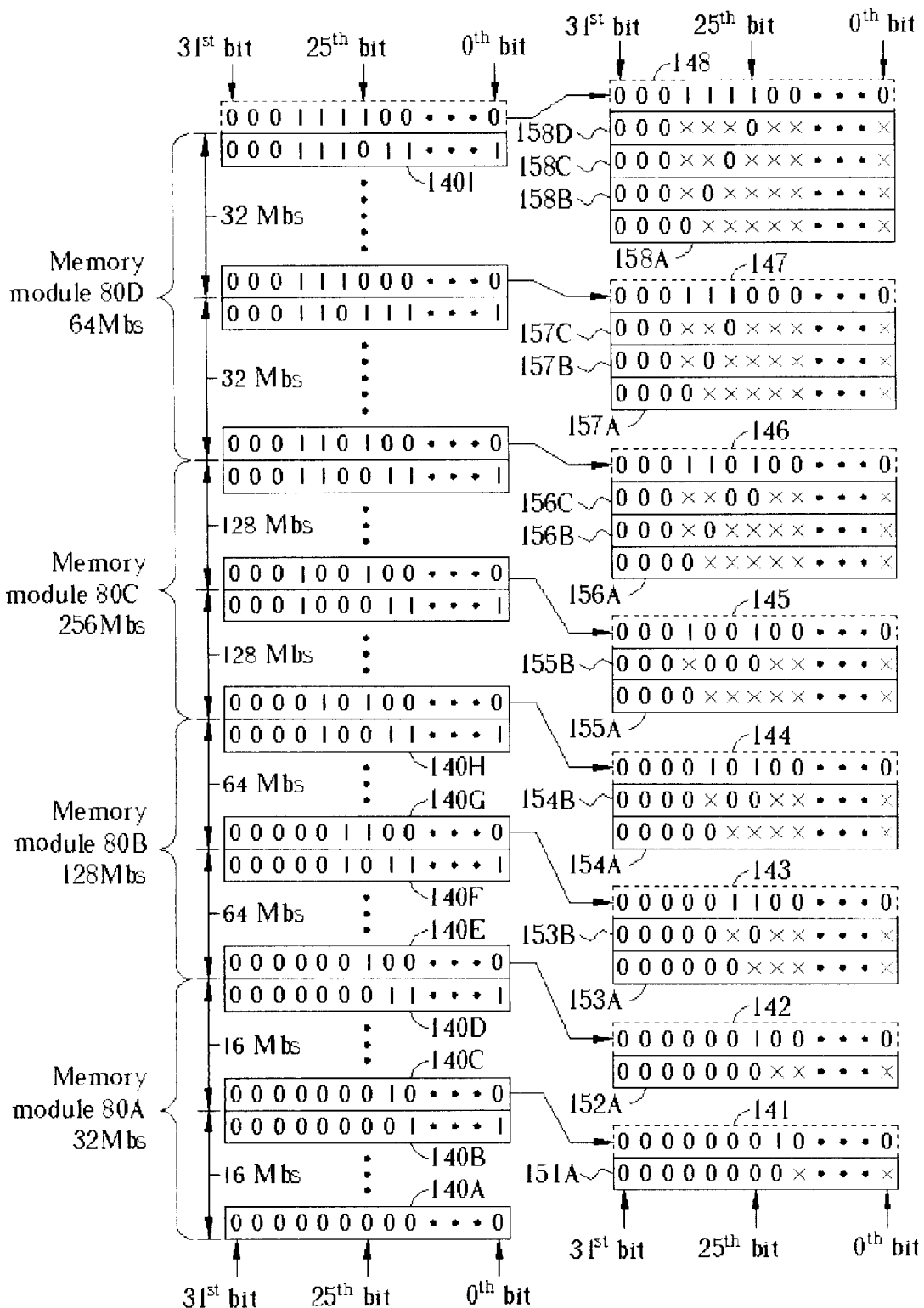
FIG. 11 illustrates the assignment of addresses to each memory unit in each memory rank and related bit patterns.

Although the previous examples of FIG. 4 to FIG. 10 discussed how the present invention determines the memory module a given address belongs to, the concepts of the present invention can be used to determine the memory rank a given address belongs to. The current memory module has two memory ranks. For example, in Double Inline Memory Module (DIMM) chips, memory units are distributed in two memory ranks. When assigned addresses, memory units of the same memory rank correspond to the increased addresses. Thus, each memory rank can define corresponding ending addresses. To apply the method of the present invention, corresponding bit patterns are calculated by the ending addresses, and addresses are decoded by bit pattern comparison to determine which memory rank the given address belongs to. As for this situation, please refer to FIG. 11. FIG. 11 illustrates address assigning, ending addresses and bit pattern in the above case of the present invention. In FIG. 11, suppose the capacities of each memory module 80A to 80D are 32 Mbs, 128 Mbs, 256 Mbs, and 64 Mbs (as in FIG. 4). The memory units of each memory module are distributed in two ranks of each memory module. For example, the memory module 80A has a total memory capacity of 32 Mbs ($2^{25}$), so each memory rank has a memory capacity of 16 Mbs. When addresses are assigned in the beginning, $2^{24}$ sequentially increased addresses are assigned to the memory units of the same memory rank first, and next, $2^{24}$ addresses are assigned to memory units of the other memory rank. As shown in FIG. 11, in the memory module 80A, $2^{24}$ addresses from address 140A to address 140B will be assigned to 16 Mbs of the same memory rank (such as the memory rank corresponding to control signal CS0 in FIG. 4). Each memory unit of the other memory rank in the memory module 80A (such as the memory rank corresponding to control signal CS1) corresponds to $2^{24}$ addresses from address 140C to address 140D. Similarly, in the memory module 80B whose total memory capacity is 128 Mbs, $2^{26}$ addresses from address 140E to address 140F are assigned to 64 Mbs of one memory rank (such as the memory rank corresponding to control signal CS2). In addition, $2^{26}$ addresses from address 140G to address 140H are assigned to 64 Mbs of the other memory rank (such as the memory rank corresponding to control signal CS3). The remaining assignments are similar.

After addresses are designed above, each memory rank defines an ending address, and each ending address has its corresponding bit pattern. Ending addresses 141 to 148 of FIG. 12 respectively correspond to each memory rank of the memory module. For example, if a given address is not smaller than the ending address 142 but smaller than the ending address 143, the given address must belong to one memory rank of memory module 80B. If a given address is not smaller than the ending address 143 but smaller than the ending address 144, the given address belongs to the second memory rank of memory module 80B. According to the method of the present invention, the corresponding bit patterns can be derived by each ending address 141 to 148. For example, bit patterns 151A and 152A of FIG. 11 correspond to ending addresses 141 and 142. Similarly, the address smaller than ending address 143 must match bit patterns 153A or 153B. Ending addresses 144 and 145 respectively correspond to bit patterns 154A, 154B and 155A, 155B. As mentioned before, three bits of "1" of ending address 146 indicate three bit patterns 156A to 156C. The address smaller than ending address 147 will match one of the bit patterns 157A, 157B, or 157C. Finally, four bits of "1" of ending address 148 represent that they correspond to four bit patterns 1510 to 158D. Please notice that the bit patterns of FIG. 11 are simplified, like the example of FIG. 6. As mentioned above, if a given address matches one bit pattern that an ending address corresponds to, the given address is smaller than the ending address. Checking if the given address matches each bit pattern that each ending address corresponds to can determine the memory rank that the given address belongs to.

Figure 12:
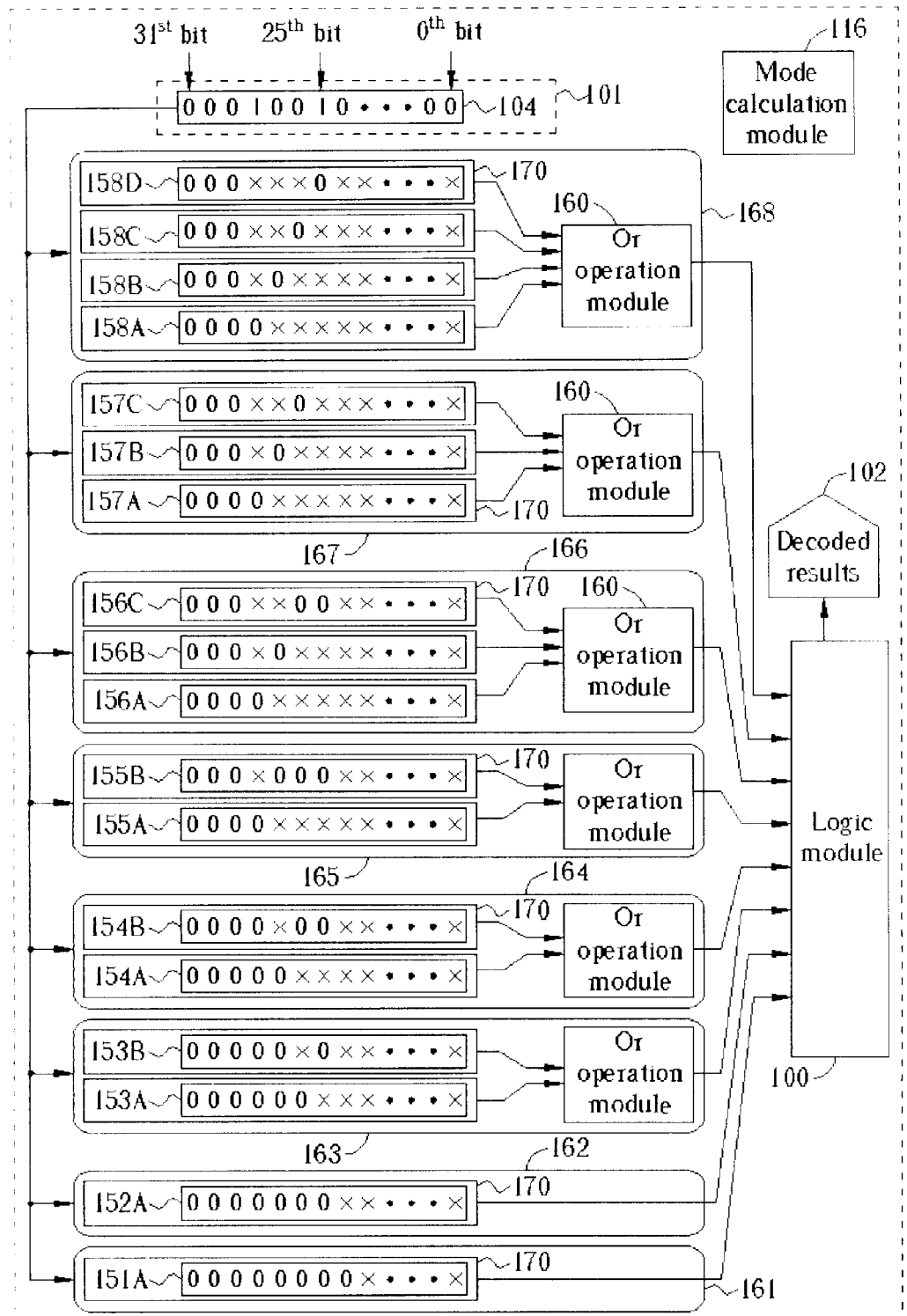
FIG. 12 illustrates the control circuit in FIG. 1 implementing bit pattern comparison of FIG. 11.

Please refer to FIG. 12. FIG. 12 illustrates the control circuit 28 implementing address decoding according to each bit pattern of FIG. 11. The control circuit 28 will assign addresses to each memory unit when the computer is started, and mode calculation module 116 can calculate the bit pattern that an ending address corresponds to. Access module 101 is to store the given address 104. Each comparison module 161 to 168 in control circuit 28 respectively determines if the given address 104 is smaller than the ending addresses 141 to 148 that each memory rank corresponds to (Please refer to FIG. 11). Each comparison unit comprises comparison unit 170, and each comparison unit is to check if the given address 104 matches one bit pattern. For example, the comparison unit 168 comprises four comparison units 170, which check if the given address 104 matches four corresponding bit patterns 1510 to 158D of ending addresses 148. Results of these four comparison units will undergo an "Or" operation by an "Or" operation module 160 so that if the given address 104 matches one of bit patterns 1510 to 158D, the comparison module 168 will determine that the given address is smaller than ending address 148. In addition, because the comparison module 142 that determines if the given address 104 is smaller than ending address 142 only corresponds to one bit pattern 152A, the comparison module 162 only needs a comparison unit 170, without an "Or" operation module. Like the example in FIG. 6, FIG. 12 supposes that the given address 104 is "0010010 . . . 0". In this example, outputs of comparison module 161 to 168 are "False", "False", "False", "False", "False", "True", and "True", meaning that the given address 104 is not smaller than ending addresses 141 to 145 but smaller than ending address 146 to 148. According to outputs of each comparison module 161 to 168 described above, the logic module 100 can determine that the given address 104 belongs to the second address rank of the address module 80C. In fact, the given address 104 "0010010 . . . 0" is the first address of the second memory rank of the memory module 80C, as shown in FIG. 11.

In address-decoding technology of the prior art, a given address and each ending address are subtracted to determine which is larger and to determine what memory module (or memory rank) the given address belongs to so as to complete address decoding. However, when a given address and an ending address undergo binary subtraction, each bit has to wait for the previous carry bit so that a complete subtraction of a given address and an ending address must proceed one bit by one bit sequentially. Therefore, the total time required is the accumulation of operation time for each bit. Address decoding in the prior art takes longer time and is less efficient. In comparison, the present invention decodes addresses by comparing each bit pattern with a given address. Because the number of fixed bits in a bit pattern is the same as their corresponding bits of a given address no matter how many bits are compared, the time that the present invention procedure for many bits takes is the same as the time for one bit. Therefore, the present invention can decode addresses fast and increase the efficiency of memory access of a computer system. The present invention can be implemented both by hardware and software. In addition, in some assignments of addresses, memory units are assigned by decreasing addresses, such as "11 . . . 111", "11 . . . 110", "11 . . . 101". The present invention can also be applied to this case.

Those skilled in the art will readily observe that numerous modifications and alterations of the device may be made while retaining the teachings of the invention. Accordingly, the above disclosure should be construed as limited only by the metes and bounds of the appended claims.

The invention claimed is:

1. A control circuit of memory address decoding for determining whether a given address is located in one of a plurality of sections in memory, each memory section having at least one memory unit and each memory unit being associated with a unique binary address, the control circuit comprising:
   a pattern calculation module for building at least one bit-pattern for each section based on the associated addresses;
   an access module for receiving the given address; and
   a comparing module for calculating a bit-pattern for each section based on the associated addresses, and sending a plurality of comparison signals after comparing at least one of the comparative bits in the given address with each bit-pattern provided by the pattern calculation module respectively, wherein the comparing module comprises a plurality of comparing units, each comparing unit comprising a plurality of NAND gates and one single AND gate, each of the NAND gates having two inputs for respectively receiving one bit of the bit-patterns and another bit associated with the given address, the inputs of the NAND gate being connected to the outputs of the AND gate and thereby sending out the comparison signals.

2. The control circuit of claim 1, further comprising a logic module responsible for receiving the comparison signals and sending a decoding result for determining the section in which the given address is located.

3. The control circuit of claim 1 wherein the sections are a plurality of memory modules.

4. The control circuit of claim 1 wherein the sections are a plurality of rank memory arrays and an even number of rank memory arrays of the same size compose a memory module.

5. The control circuit of claim 1 wherein at least one bit-pattern is built for each section in the pattern calculation module, the bit-patterns consisting of all common bits of the associated addresses in each section.

6. The control circuit of claim 1 wherein at least one bit-pattern is built for each section in the pattern calculation module, the bit-patterns consisting of partial common bits of the associated addresses in each section.

7. A memory address decoding method for determining an objective section of a given address in a memory, wherein the memory is formed by at least one section, which comprises at least one memory unit having a corresponding address, the method comprising:
   obtaining at least one bit-pattern according to a common pattern of bits of the addresses;

comparing the given address with each bit-pattern to determine the objective section of the given address;

comparing the given address with at least one ending address to determine an objective group of the objective section, wherein the ending address is substantially equal to the first address or the last address of each section; and storing the objective group in memory.

8. The method of claim 7, wherein bits of the given address are correspondingly compared to the bit-pattern.

9. The method of claim 7, wherein each section comprises at least one bit-pattern.

10. The method of claim 7, wherein the given address is compared with bit-patterns of the objective group.

11. The method of claim 7, wherein the bit-pattern is obtained by all common bits of the address in each section.

12. The method of claim 7, wherein the bit-pattern is obtained by partial common bits of the address in each section.

13. The method of claim 7, wherein the given address is located in the objective section when bits of the given address completely match the bit-pattern of the objective section.

14. The method of claim 7, wherein each section is formed by at least one memory module.

* * * * *